(12) United States Patent
Ing et al.

(10) Patent No.: US 10,442,375 B2
(45) Date of Patent: *Oct. 15, 2019

(54) INTEGRATED POWER SYSTEMS FOR ELECTRIC VEHICLES

(71) Applicant: NIO USA, Inc., San Jose, CA (US)

(72) Inventors: Adam H Ing, Santa Clara, CA (US); Alexander J Smith, White Lake, MI (US); Rick Rajaie, Rochester Hills, MI (US); Peng Chen, San Jose, CA (US); Miaosen Shen, Fremont, CA (US)

(73) Assignee: NIO USA, Inc., San Jose, CA (US)

( * ) Notice: Subject to any disclaimer, the term of this patent is extended or adjusted under 35 U.S.C. 154(b) by 39 days.

This patent is subject to a terminal disclaimer.

(21) Appl. No.: 15/654,953

(22) Filed: Jul. 20, 2017

(65) Prior Publication Data

US 2019/0023201 A1    Jan. 24, 2019

(51) Int. Cl.
*B60R 16/033* (2006.01)
*H05K 7/20* (2006.01)
*H01M 2/10* (2006.01)
*H01M 10/6556* (2014.01)
*H01M 10/625* (2014.01)
(Continued)

(52) U.S. Cl.
CPC ............ *B60R 16/033* (2013.01); *B60L 58/00* (2019.02); *H01M 2/1077* (2013.01); *H01M 10/613* (2015.04); *H01M 10/625* (2015.04); *H01M 10/6556* (2015.04); *H05K 7/209* (2013.01); *H05K 7/20927* (2013.01); *H01M 2220/20* (2013.01)

(58) Field of Classification Search
CPC ............. B60R 16/023; H01M 10/613; H01M 10/6556; H01M 2/1077; H01M 2220/20; H05K 7/209; H05K 7/20927
See application file for complete search history.

(56) References Cited

U.S. PATENT DOCUMENTS

| 1,007,697 A1 | 9/2018 | Huang et al. |
| 2012/0007557 A1 | 1/2012 | Hayashigawa |
| 2016/0352131 A1 | 12/2016 | Nelson |

(Continued)

OTHER PUBLICATIONS

U.S. Appl. No. 15/654,583, filed Jul. 19, 2017, Chen et al.
(Continued)

*Primary Examiner* — Robert L Deberadinis
(74) *Attorney, Agent, or Firm* — Sheridan Ross P.C.

(57) ABSTRACT

A power module for a vehicle includes a first bidirectional voltage converter to convert a first voltage to a second voltage and convert the second voltage back to the first voltage. The power module includes a second bidirectional voltage converter to convert the first voltage to a third voltage and convert the third voltage back to the first voltage. The power module includes a first battery coupled to the first bidirectional voltage converter to receive the second voltage, and a second battery coupled to the second bidirectional voltage converter to receive the third voltage. The power module includes a controller to control the first and second bidirectional voltage converters and the first and second batteries. The first voltage is for supplying power to a powertrain of the vehicle. The second voltage and the third voltage are for supplying power to the first and second batteries, respectively.

20 Claims, 6 Drawing Sheets

(51) Int. Cl.
*H01M 10/613* (2014.01)
*B60L 58/00* (2019.01)

(56) References Cited

U.S. PATENT DOCUMENTS

| | | |
|---|---|---|
| 2017/0012324 A1 | 1/2017 | Giordano et al. |
| 2017/0141368 A1 | 5/2017 | Ricci |
| 2017/0225588 A1 | 8/2017 | Newman |
| 2019/0023149 A1* | 1/2019 | Chen .................. B60L 11/1868 |

OTHER PUBLICATIONS

U.S. Appl. No. 15/712,532, filed Sep. 22, 2017, Ing et al.
U.S. Appl. No. 15/721,428, filed Sep. 29, 2017, Liu et al.
Diebig et al., "Optimizing Multi-Voltage Automotive Power Supply Systems Using Electro-Thermal Simulation," EEHE, 2014, retrieved from http://www.bordsysteme.tu-dortmund.de/publications/2014_EEHE_Diebig_optimizing_multi_voltage_automotive_power_supply_systems_using_electro_thermal_simulation.pdf, 16 pages.
Official Action for U.S. Appl. No. 15/654,583, dated Feb. 7, 2019 6 pages.

* cited by examiner

INTEGRATED POWER SYSTEMS FOR ELECTRIC VEHICLES

FIELD

The present disclosure is generally directed to vehicle systems, and more particularly to vehicle power systems.

BACKGROUND

Most vehicles, in particular electric and hybrid vehicles, include power systems usually referred to as battery management systems (BMSs) that monitor and control the operation of the batteries within the vehicles. For example, the BMS of an electric vehicle controls the vehicle's powertrain as well as auxiliary components or features, such as heating and cooling components, dashboard electronics, etc. Many electric vehicles utilize a high capacity, high voltage battery to drive the vehicle's powertrain and utilize a lower capacity and lower voltage battery for the auxiliary components. However, as the industry continues to add auxiliary features to vehicles, additional/alternative power systems are desired.

DETAILED DESCRIPTION

Embodiments of the present disclosure will be described in connection with a vehicle, and more particularly with respect to an automobile. However, for the avoidance of doubt, the present disclosure encompasses the use of the aspects described herein in vehicles other than automobiles.

Figure 1:
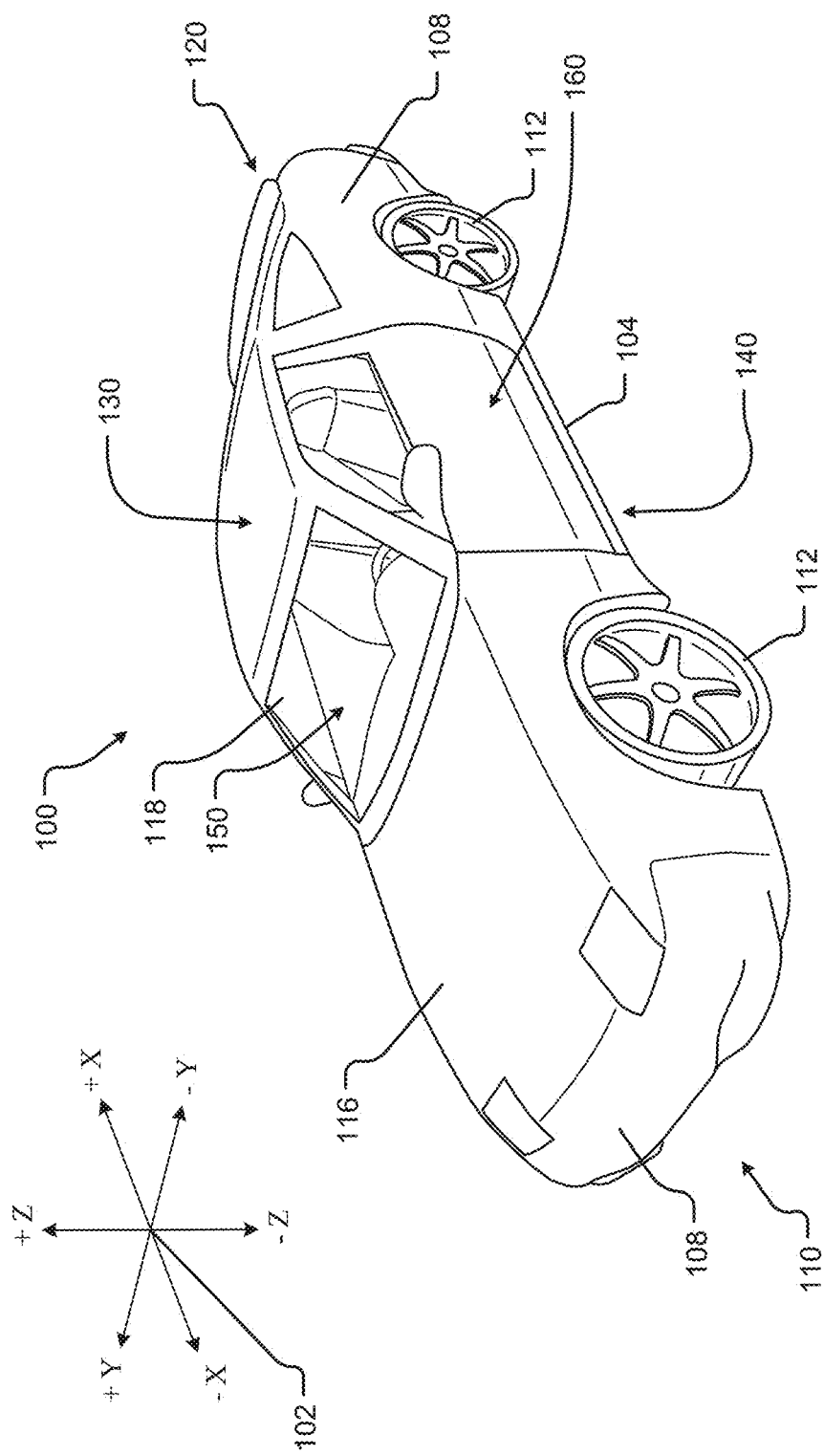
FIG. 1 shows a vehicle in accordance with at least one example embodiment.

FIG. 1 shows a perspective view of a vehicle (or electric vehicle) 100 in accordance with embodiments of the present disclosure. The vehicle 100 comprises a vehicle front 110, vehicle aft 120, vehicle roof 130, at least one vehicle side 160, a vehicle undercarriage 140, and a vehicle interior 150. The vehicle 100 may include a frame 104, one or more body panels 108 mounted or affixed thereto, and a windshield 118. The vehicle 100 may include one or more interior components (e.g., components inside an interior space 150, or user space, of a vehicle 100, etc.), exterior components (e.g., components outside of the interior space 150, or user space, of a vehicle 100, etc.), drive systems, controls systems, structural components, etc.

Coordinate system 102 is provided for added clarity in referencing relative locations in the vehicle 100. In this detailed description, an object is forward of another object or component if the object is located in the −X direction relative to the other object or component. Conversely, an object is rearward of another object or component if the object is located in the +X direction relative to the other object or component.

The vehicle 100 may be, by way of example only, a battery electric vehicle (BEV) or a hybrid electric vehicle (HEV). Where the vehicle 100 is BEV, the vehicle 100 may comprise one or more electric motors powered by electricity from an on-board battery pack. The electric motors may, for example, be mounted near or adjacent an axis or axle of each wheel 112 of the vehicle, and the battery pack may be mounted on the vehicle undercarriage 140. In such embodiments, the front compartment of the vehicle, referring to the space located under the vehicle hood 116, may be a storage or trunk space. Where the vehicle 100 is an HEV, the vehicle 100 may comprise the above described elements of a BEV with the addition of a gas-powered (or diesel-powered) engine and associated components in the front compartment (under the vehicle hood 116), which engine may be configured to drive either or both of the front wheels 112 and the rear wheels 112. In some embodiments where the vehicle 100 is an HEV, the gas-powered engine and associated components may be located in a rear compartment of the vehicle 100, leaving the front compartment available for storage or trunk space or for other uses. In some embodiments, the vehicle 100 may be, in addition to a BEV and an HEV, a fuel cell vehicle.

Although shown in the form of a car, it should be appreciated that the vehicle 100 described herein may include any conveyance or model of a conveyance, where the conveyance was designed for the purpose of moving one or more tangible objects, such as people, animals, cargo, and the like. Typical vehicles may include but are in no way limited to cars, trucks, motorcycles, buses, automobiles, trains, railed conveyances, boats, ships, marine conveyances, submarine conveyances, airplanes, space craft, flying machines, human-powered conveyances, and the like.

The vehicle 100 may be capable of autonomous operation, wherein one or more processors receive information from various sensors around the vehicle and use that information to control the speed and direction of the vehicle 100 so as to avoid hitting obstacles and to navigate safely from an origin to a destination. In such embodiments, a steering wheel is unnecessary, as the one or more processors, rather than a vehicle occupant, control the steering of the vehicle 100.

Figure 2:
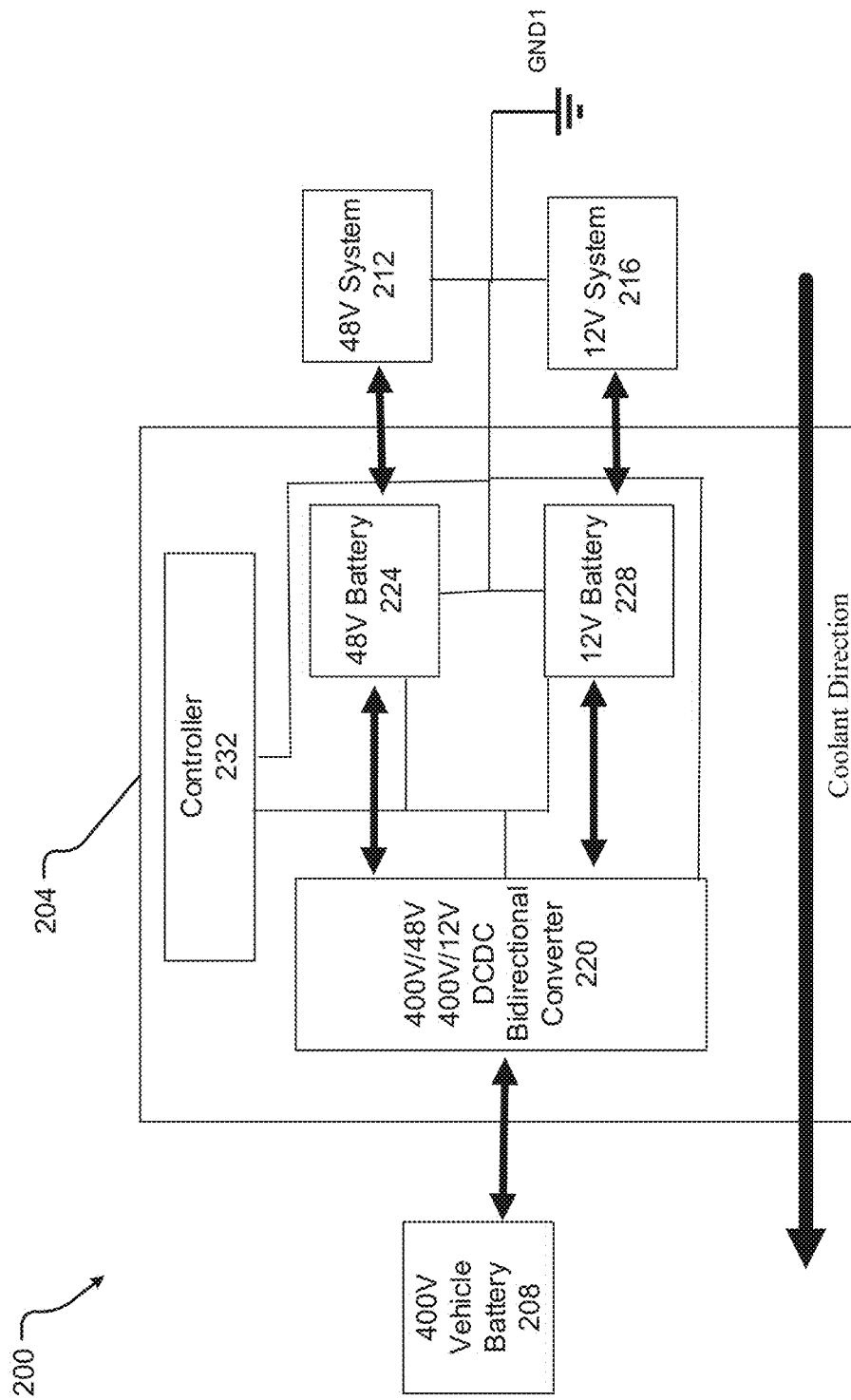
FIG. 2 is an example schematic of an integrated power system in accordance with at least one example embodiment.

FIG. 2 is an example schematic of an integrated power system 200 in accordance with at least one example embodiment. The integrated power system 200 controls the overall operation of electric motors and components within the vehicle 100.

FIG. 2 shows that the integrated power system 200 includes a power module 204, a vehicle battery 208 (or high voltage power source), a first low voltage system (or first set of auxiliary components) 212, and a second low voltage system (or second set of auxiliary components) 216. FIG. 2 illustrates an example embodiment where the vehicle battery 208 is a 400V direct current (DC) power source, the first low voltage system 212 is a 48V DC system, and the second low voltage system 216 is a 12V DC system. In view of these three power sources with different operating voltages, it may be said that the integrated power system 200 has a 3-voltage architecture.

The vehicle battery 208 supplies power to a powertrain of the vehicle 100, which should be understood to include the electric motor that controls the motion of the vehicle 100.

The first and second low voltage systems 212/216 represent components other than the powertrain, such as auxiliary components of the vehicle 100, which may include cabin heating and cooling components, dashboard electronics, etc. In at least one example embodiment, the first low voltage system 212 may include onboard computers (e.g., in the case where the vehicle 100 is an autonomous vehicle utilizing high performance computers), while the second low voltage system 216 includes other auxiliary components, such as dashboard electronics/displays.

As shown in FIG. 2, the power module 204 includes a bidirectional converter 220, one or more power sources 224/228 (i.e., a first low voltage power source or a first battery 224, a second low voltage power source or a second battery 228), and a controller 232 to control the overall operation of the integrated power system 200. The controller 232 can be embodied by hardware (e.g., as an application specific integrated circuit (ASIC)), software, or as a combination of hardware and software (e.g., as a special-purpose processor or microprocessor executing instructions on a computer readable storage medium). That is, the controller 232 is able to send, receive, and/or process information/signals within the electrical vehicle 100, including the integrated power system 200. The controller 232 is coupled to the other elements of the integrated power system 200 by, for example, a system bus.

In FIG. 2, the first low voltage power source 224 is a 48V DC battery that supplies power to the first low voltage system 212, and the second low voltage power source 228 is a 12V DC battery that supplies power to the second low voltage system 216.

In at least one example embodiment, the bidirectional voltage converter 220 is implemented by a non-isolated DCDC converter coupled to an isolated, dual output LLC resonant converter. Here, non-isolated refers to devices with different voltage levels sharing a same ground or common voltage while isolated refers to a device(s) that does not share a common ground or common voltage with another device with a different voltage level. An advantage of the non-isolated architecture is that the number of interfaces/terminals are reduced, which reduces overall cost.

Although FIG. 2 has been described with respect to specific voltage values/capacities for elements 208, 212, 216, 220, 224, and 228, example embodiments are not limited thereto. For example, the voltages/capacities of each of these elements may vary according to design preferences of the vehicle 100.

In operation, the bidirectional voltage converter 220 i) converts a first voltage to a second voltage and converts the second voltage back to the first voltage, and ii) converts the first voltage to a third voltage and converts the third voltage back to the first voltage. Further, the one or more power sources 224/228 are coupled to the at least one bidirectional voltage converter and supply power to auxiliary components of the electric vehicle 100. The power module 204 includes the controller 232 to control the bidirectional voltage converter 220 and the one or more power sources 228.

In at least one example embodiment, the first voltage is for supplying power to a powertrain of the electric vehicle 100 while the second voltage and the third voltage are for supplying power to the one or more power sources 224/228. Here, the first voltage is 400V, the second voltage is 48V, and the third voltage is 12V.

According to at least one example embodiment, the one or more power sources 224/228 comprise a first battery 224 (e.g., a 48V battery) and a separate, second battery 228 (e.g., a 12V battery). The first and second batteries supply power to the first and second low voltage systems 212/216, respectively.

Figure 4:
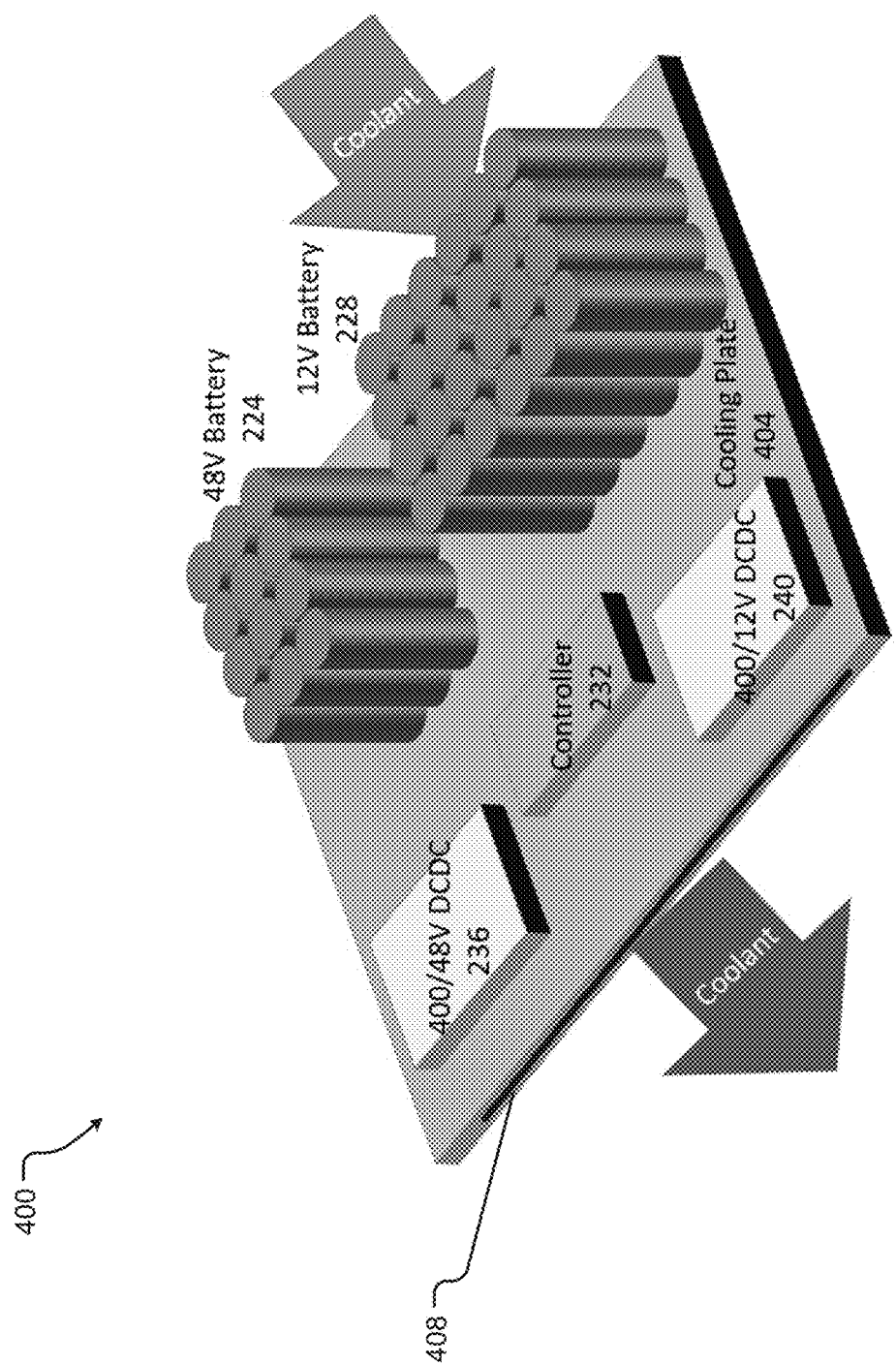
FIG. 4 illustrates an example arrangement of the integrated power system of FIG. 3 on a cooling plate or support plate in accordance with at least one example embodiment.

In at least one other example embodiment, the one or more power sources 224/228 comprise a single group of battery cells (e.g., a single battery pack) that includes a first set of battery cells that act as power source 224 and a second set of battery cells that act as power source 228 (see FIG. 4, for example). The first set of battery cells supplies power to a first set of the auxiliary components (e.g., system 212) that operate using the second voltage, and the second set of battery cells supply power to a second set of the auxiliary components (e.g., system 216) that operate using the third voltage. In view of the above, it should be understood that the first set of battery cells may include the second set of battery cells. That is, the first set of battery cells represents the complete bank (or group) of battery cells while the second set of battery cells represent a portion of the complete bank of battery cells. For example, if the complete bank (or first set) of battery cells is capable of providing 48V (e.g., to the first low voltage system 212), then the second set of battery cells (that provide power to the second low voltage system 216) is created by tapping the first set of battery cells (i.e., the complete bank of battery cells) at a location that accomplishes the voltage desired (e.g., 12V) and power desired for the second low voltage system 216. This effectively splits the complete bank of battery cells into a 12V section and a 36V section.

Regardless of whether the one or more power sources 224/228 are implemented by separate batteries or a single group of battery cells split into two sets, the controller 232 balances the load on the bi-directional voltage converter 220 such that the first battery or first set of battery cells and the second battery or the second set of battery cells receive a desired amount of power. The desired amount of power is a design parameter set based on empirical evidence and/or user preference. In at least one example embodiment, the first set of battery cells or the first battery have a first capacity and the second set of battery cells or the second battery have a second capacity different from the first capacity (where capacity refers to a value represented in Amp-hours or kW-hours).

In FIG. 2, the bidirectional voltage converter 220 is a single bidirectional voltage converter that includes a first I/O port to send and receive the first voltage to/from the vehicle battery 208, a second I/O port to send and receive the second voltage to/from the first low voltage source 224, and a third port to I/O send and receive the third voltage to/from the second low voltage source 228. The one or more power sources 224/228, the controller 232, the second port and the third port are connected to a common ground or a common voltage GND1. That is, the low voltage components of the system 200 (i.e., elements 224, 228, 232, 212, 216, and the low voltage side of the bidirectional voltage converter 220) share a common ground or a common voltage GND1.

The one or more power sources 224/228 have a capacity (or a desired number of Amp-hours or kW-hours) sufficient enough such that in the event of a failure of the vehicle battery 208 that supplies the first voltage (e.g., 400V) to the powertrain of the vehicle 100, the controller 232 causes the bidirectional voltage converter 220 to convert at least one of i) the second voltage to the first voltage and ii) the third voltage to the first voltage to temporarily supply power (e.g., at 400V) to the powertrain. That is, the one or more power sources 224/228 through the bidirectional converter 220 may be capable of providing enough power (e.g., 3.5 kW) to power the vehicle 100, at least temporarily. Here, it should be understood that the amount of power provided by the one or more power sources 224/228 is a design parameter set based on empirical evidence and/or user preference. For example, more power can be accomplished by adding or activating additional battery cells in parallel with the one or more power sources 224/228 and less power can be achieved by removing or inactivating battery cells within the one or more power sources 224/228.

FIG. 2 further shows a flow direction of coolant through/over the components of the power module 204. The coolant direction is described in more detail below with reference to FIG. 4.

Figure 3:
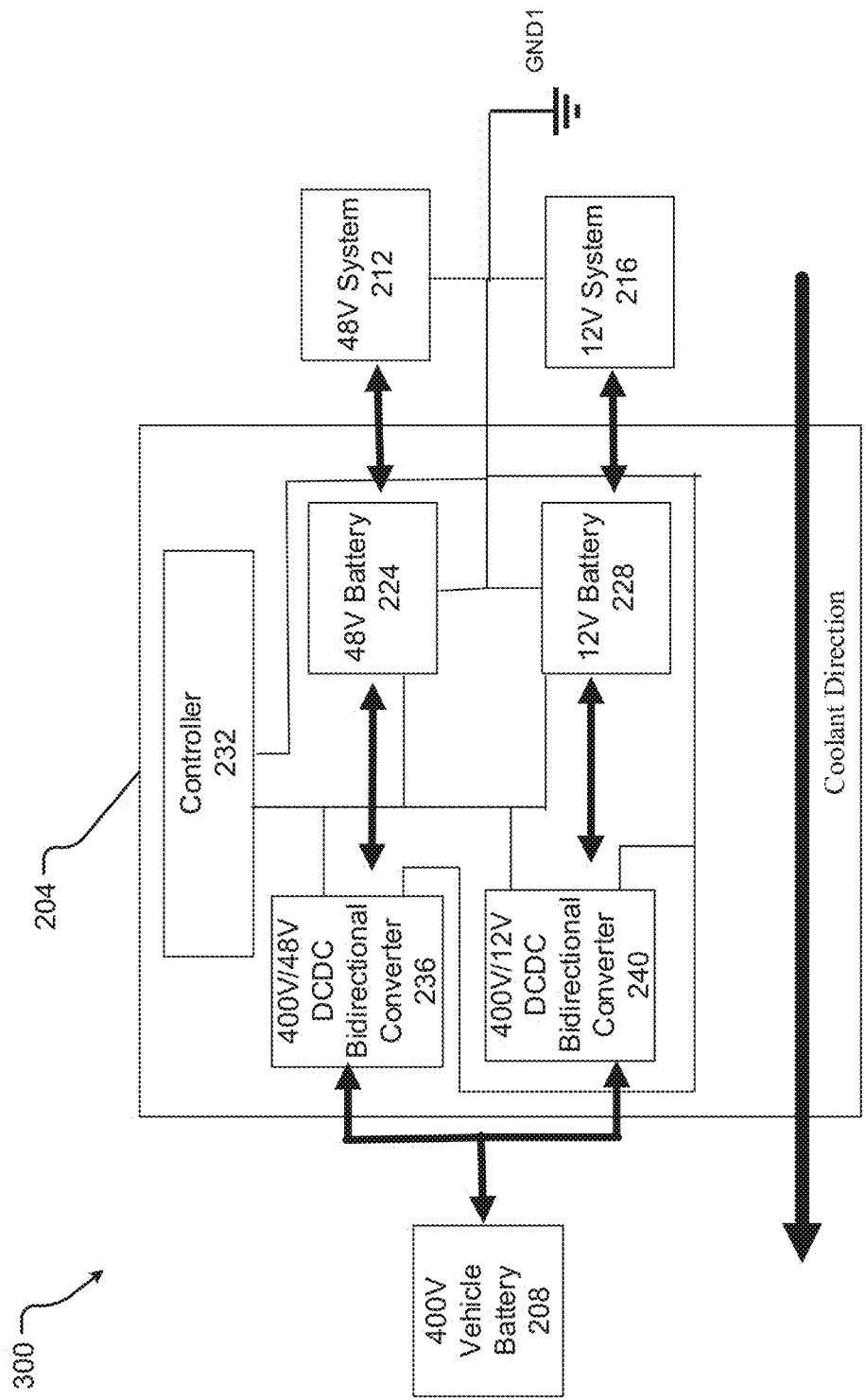
FIG. 3 is another example schematic of an integrated power system in accordance with at least one example embodiment.

FIG. 3 is another example schematic of an integrated power system in accordance with at least one example embodiment. FIG. 3 includes the same elements as FIG. 2 except for the system 300 of FIG. 3 shows a first bidirectional voltage converter 236 and a second bidirectional voltage converter 240 instead of a single bidirectional voltage converter 220. Here, the first bidirectional voltage converter 236 converts the first voltage to the second voltage and converts the second voltage back to the first voltage. The second bidirectional voltage converter 240 converts the first voltage to the third voltage and the third voltage back to the first voltage. In this case, the first bidirectional voltage converter 236 includes a first I/O port to send and receive the first voltage to/from the vehicle battery 208 and a second I/O port to send and receive the second voltage to/from power source 224. Likewise, the second bidirectional voltage converter 240 includes third I/O port to send and receive the first voltage t/from the vehicle battery 208 and a fourth I/O port to send and receive the third voltage to/from the power source 228. Similar to FIG. 2, the low voltage components of system 300 (i.e., elements 224, 228, 232, 212, 216, and the low voltage sides of the first and second bidirectional voltage converters 236 and 240) share a common ground or a common voltage GND1.

Example embodiments according to at least FIG. 3 allow for the controller 232 to control at least one of the power sources 224/228 to precharge the first and second bidirectional voltage converters 236/240. For example, the controller 232 controls the voltage(s) of the one or more power sources 224/228 to be converted (by the bidirectional voltage converters 236/240) to the voltage of the vehicle battery 208 prior to connecting the vehicle battery 208 to the power module 204. This mitigates (or alternatively) prevents damage that may otherwise be caused by the in-rush of current from the vehicle battery 208 to the power module 204 when the vehicle battery 208 is connected to the power module 204 during a driving mode of the vehicle 100. The precharge operation is discussed in more detail with reference to FIG. 5.

In view of FIGS. 2 and 3, it should be understood that example embodiments are directed to a power system 200/300 for an electrical vehicle 100. The power system 200/300 includes a high voltage circuit that includes a high voltage source 208 to supply a high voltage (e.g., 400V) to a powertrain of the electric vehicle 100. The high voltage circuit may comprise the vehicle battery 208 and the high voltage side(s) of at least one bidirectional voltage converter 220 or 236/240. The power system 200/300 includes a low voltage circuit that includes at least two low voltage sources 224/228 to supply at least two different low voltages (e.g., 48V and 12V) to auxiliary components (or systems) 212/216 of the electric vehicle 100. The power system 200/300 includes at least one bidirectional voltage converter 220 or 236/240 coupled between the high voltage circuit and the low voltage circuit and that converts the high voltage provided by the high voltage source 208 to the two different low voltages and that converts the two different low voltages provided by the at least two low voltage sources 224/228 to the high voltage. According to at least one example embodiment, the low voltage circuit further comprises the controller 232 to control the at least one bidirectional voltage converter 220 or 236/240 and the at least two low voltage sources 224/228, a low voltage side of the at least one bidirectional voltage converter 220 or 236/240 (i.e., the 48V and 12V side), and the auxiliary components or systems 212/216.

As shown in FIGS. 2 and 3, the at least two low voltage sources 212/216, the controller 232, the low voltage side, and the auxiliary components 212/216 share a common ground or a common voltage GND1.

FIG. 4 illustrates an example arrangement 400 of the power module of FIG. 3 on a cooling plate or support plate 404 in accordance with at least one example embodiment.

Here, the support plate 404 supports the first and second bidirectional voltage converters 236/240, the one or more power sources 224/228, and the controller 232. As shown, the one or more power sources 224/228 are arranged on a first face and at a first side of the support plate 404, and the controller 232 and the first and second bidirectional voltage converters 236/240 are arranged on the first face and at a second side of the support plate 404 opposite to the first side. The support plate 404, the first and second bidirectional voltage converters 236/240, the controller 232, and the one or more power sources 224/228 are in a path of a coolant that travels from the first side toward the second side.

In view of FIG. 4, it may be said that the arrangement 400 includes a support plate, first and second batteries (or a group of battery cells) 224/228 to supply a first voltage to a first set of auxiliary components of the electric vehicle and to supply a second voltage different from the first voltage to a second set of auxiliary components of the electric vehicle. For example, with reference FIG. 3, the first voltage may be 48V while the second voltage is 12V, and the first set of auxiliary components may be auxiliary components 212 while the second set of auxiliary components may be auxiliary components 216. As shown in FIG. 4, first and second batteries 224/228 is attached to the support plate 404.

With reference FIGS. 3 and 4, the first and second bidirectional voltage converters 236/240 are coupled to the first and second batteries 224/228 and coupled to an external power source (e.g. vehicle battery 208) that supplies power to a powertrain of the electric vehicle 100. As shown in FIG. 4, the first and second bidirectional voltage converters 236/240 are attached to the support plate. FIG. 4 also shows the controller 232 to control operation of the first and second batteries 224/228 through the first and second bidirectional voltage converters 236/240. The controller 232 is also attached the support plate 404. The support plate 404 may comprise a heat sink material, such as aluminum or other suitable material.

As shown in FIG. 4, the support plate 404 includes a coolant channel 408 to carry coolant. The coolant channel 408 may comprise a slit or opening that travels from one side of the support plate 404 to an opposite side of the support plate 404. The coolant may be a liquid coolant or pressurized refrigerant coolant that cools the components on the support plate 404 during operation by removing heat transferred from the components to the support plate 404. FIG. 4 illustrates how the first and second batteries 224/228 are attached to the support plate 404 such that when the support plate 404 is in the coolant channel, the coolant cools the first and second batteries 224/228 before cooling the first and second bidirectional voltage converters 236/240 and the controller 232. This is because the first and second batteries 224/228 usually have a maximum temperature (e.g., about 60° C.) that is cooler than a maximum temperature of the bidirectional converters 236/240 (e.g., about 120° C.). The arrangement 400 provides an integrated cooling system for both of the bidirectional converters 236/240 and the first and second batteries 224/228. It should be appreciated that example embodiments are not limited to the arrangement 400 and the direction of the coolant shown in FIG. 4, both of which can be altered according to design preferences.

According to at least one embodiment, the first and second batteries 224/228, the bidirectional voltage controllers 236/240 and the controller 232 are attached to first face of the support plate 204 by any known adhesive or other mechanical connection.

The first and second batteries 224/228 are rechargeable. In a driving mode of the electric vehicle 100, the controller 232 charges the first and second batteries 224/228 through the first and second bidirectional voltage converters 236/240 (e.g., by converting 400V to 48V and/or 12V and supplying the converted power to the batter cells 224/228). In a precharge mode of the electric vehicle 100 (i.e., prior to the external power source 208 being connected to the power module 204), the controller 232 causes the first and second batteries 224/228 to precharge at least one of the first and second bidirectional voltage converters 236/240 prior to being connected to the external power source 208.

Although FIG. 4 has been described with reference an example embodiment of the power system shown in FIG. 3, it should be understood that the example arrangement of FIG. 4 may also apply to the power system shown in FIG. 2. In this case, the bidirectional voltage converter 220 is substituted into the position of the first and second bidirectional voltage converters 236/240 in FIG. 4.

Figure 5:
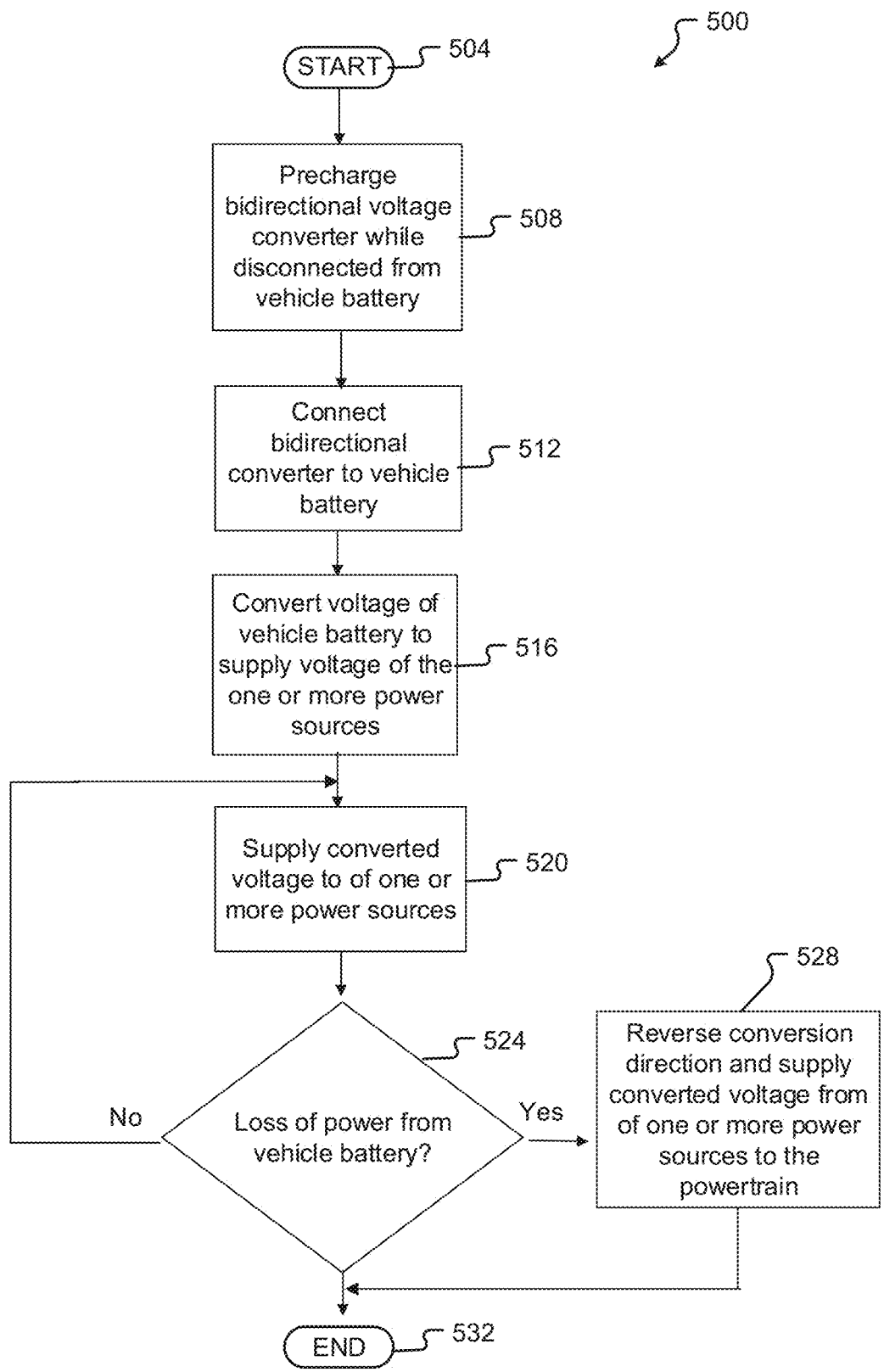
FIG. 5 is a flow diagram illustrating example operations of the system in FIG. 3 for a driving mode a vehicle in accordance with at least one example embodiment.

FIG. 5 is a flow diagram illustrating example operations of system 300 in FIG. 3 for a driving mode of the vehicle 100.

While a general order for the steps of the method 500 is shown in FIG. 5, the method 500 can include more or fewer steps or can arrange the order of the steps differently than those shown in FIG. 5. Generally, the method 500 starts at operation 504 and ends at operation 532. The method can be executed as a set of computer-executable instructions executed by the controller 232 and encoded or stored on a computer readable medium. Alternatively, the operations discussed with respect to FIG. 5 may be implemented by the various elements of the system 300 described with respect to FIGS. 3-4. Hereinafter, the FIG. 5 shall be explained with reference to the systems, components, assemblies, devices, user interfaces, environments, software, etc. described in conjunction with FIGS. 1-4.

In operation 508, the first and second bidirectional voltage converters 236/240 are precharged while also disconnected from the vehicle battery 208. In this case, precharging includes coupling the one or more power sources 224/228 to the low voltage sides of bidirectional voltage converters 236/240 so that the low voltage(s) (e.g., 12V and/or 48V) of the one or more power sources 224/228 are converted to the high voltage (e.g., 400V) so that the high voltage sides of the bidirectional voltage converters 236/240 are charged to the high voltage. The coupling can be achieved by closing switches or contactors that control the flow of current between the bidirectional voltage converters 236/240 and the one or more power sources 224/228.

In operation 512, the high voltage sides of the bidirectional voltage converters 236/240 are connected to the vehicle battery 208 (e.g., by switches or contactors). Because the high voltage sides of the bidirectional voltage converters 236/240 have been charged to the high voltage, damage to the switches or contactors caused by the inrush of current upon connection of the bidirectional voltage converters 236/240 to the vehicle battery 208 is mitigated (or alternatively, prevented). Now, the vehicle 100 is ready to drive.

In operation 516, during driving of the vehicle 100, the method 500 causes the bidirectional converters 236/240 to convert the high voltage of the vehicle battery 208 into the supply voltage of the one or more power sources 224/228 (e.g., 12V and 48V).

In operation 520, during driving of the vehicle 100, the method 500 supplies the voltage(s) resulting from the conversion operation 515 to the one or more power sources 224/228. Now, the one or more power sources 224/228 can be charged through the vehicle battery 208 (e.g., where the vehicle battery 208 is also charged by regenerative power sources, such as regenerative braking).

In operation 524, the method 500 checks whether there is a loss of power from the vehicle battery 208 to the powertrain of the vehicle 100 (e.g., due to a disconnection of the vehicle battery 208 or a failure of the vehicle battery 208). If so, operation 528 causes a reversal of the conversion direction of the bidirectional voltage converters 236/238 so that the voltage provided by one or more power sources 224/228 is converted to the vehicle battery voltage 208 (e.g., 400V). The converted voltage from the one or more power sources 224/228 is supplied to the powertrain of the vehicle 100 at least temporarily so that the vehicle 100 can be safely removed from the flow of traffic. If in operation 524 no power loss is detected, then the method 500 returns to operation 520 and continues to supply the converted vehicle battery voltage to charge the one or more power sources 224/228.

Figure 6:
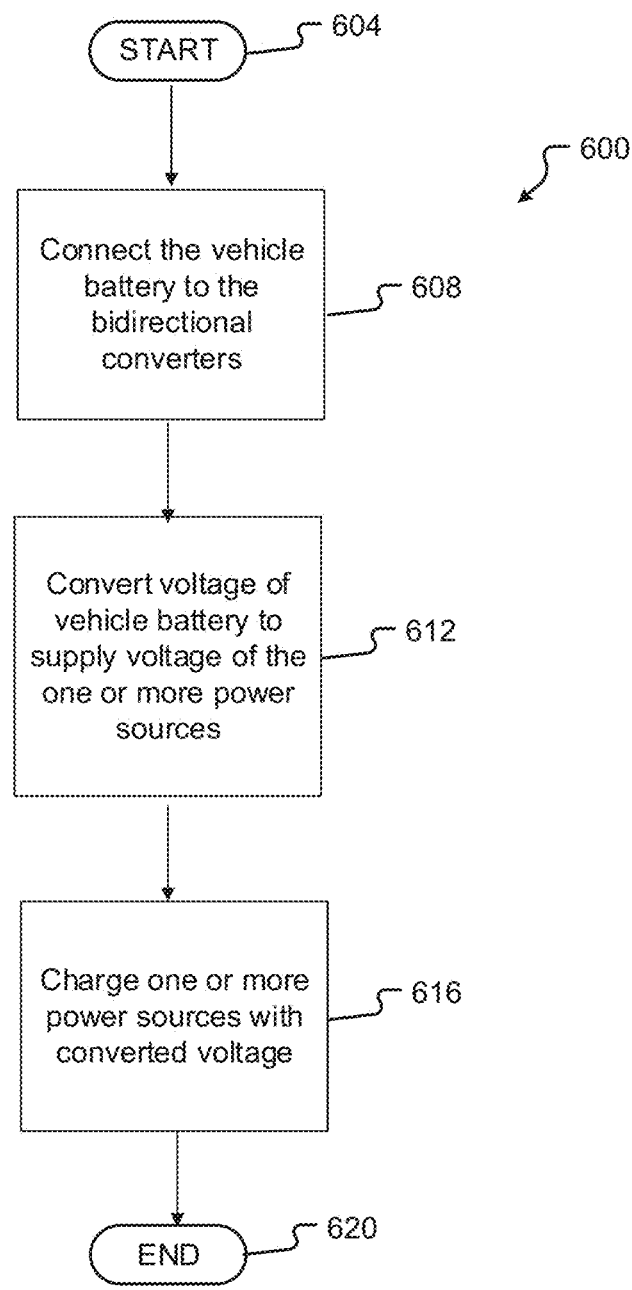
FIG. 6 is a flow diagram illustrating example operations of the system in FIG. 3 for a charging mode of a vehicle in accordance with at least one example embodiment.

FIG. 6 is a flow diagram illustrating example operations of the system 300 in FIG. 3 for a charging mode of the vehicle 100.

While a general order for the steps of the method 600 is shown in FIG. 6, the method 600 can include more or fewer steps or can arrange the order of the steps differently than those shown in FIG. 6. Generally, the method 600 starts at operation 604 and ends at operation 620. The method can be executed as a set of computer-executable instructions executed by the controller 232 and encoded or stored on a computer readable medium. Alternatively, the operations discussed with respect to FIG. 6 may be implemented by the various elements of the system 300 described with respect to FIG. 3. Hereinafter, the FIG. 6 shall be explained with reference to the systems, components, assemblies, devices, user interfaces, environments, software, etc. described in conjunction with FIGS. 1-4.

In operation 608, vehicle battery 208 is connected to the bidirectional converters 236/240, for example, under control of the controller 232. At this point, the vehicle battery 208 should then be connected or already is connected to another power source for charging (e.g., at an appropriate vehicle charging station).

In operation 612, the bidirectional voltage converters 236/240 convert the voltage of the vehicle battery 208 to the supply voltages of the one or more power sources (e.g., the second and third voltages).

In operation 616, the bidirectional voltage converters 236/240 charge the one or more power sources with the converted voltages (i.e., supply the second and third voltages to the power sources 224 and 228, respectively). Now, the power sources 224/228 are being charged along with the vehicle battery 208.

Although FIGS. 5 and 6 have been described with respect to the system 300 FIG. 3, it should be understood that the operations of FIGS. 5 and 6 also apply to the system 200 of FIG. 2. In this case, the bidirectional voltage converter 220 is substituted for the bidirectional voltage converters 236/240.

FIGS. 2-6 have been described with respect to a particular number of vehicle batteries, bidirectional voltage converters, low voltage power sources, and low voltage systems. However, example embodiments are not limited thereto, and the number of each of these elements may vary according to design preferences. For example, in the event that it is desired to have auxiliary components of the vehicle 100 operating at three or more different voltages, then the number of corresponding bidirectional voltage converters and associated power sources may increase proportionally without departing from the scope of example embodiments.

In view of the foregoing description, it should be appreciated that one or more example embodiments provide an integrated power system for an electric vehicle that may reduce cost and footprint of the power system as well as the overall weight of the vehicle. One or more example embodiments also provide a flexible power architecture that can be altered by removing battery cells and/or adding more battery cells in series or parallel. Furthermore, the coordination between components of the power system is less complex due to these components being under control of a single controller. Moreover, example embodiments (e.g., according to FIG. 3) provide redundant boost precharge functions.

Embodiments include a power module for an electric vehicle. The power module includes a first bidirectional voltage converter to convert a first voltage to a second voltage and convert the second voltage back to the first voltage. The power module includes a second bidirectional voltage converter to convert the first voltage to a third voltage and convert the third voltage back to the first voltage. The power module includes a first battery coupled to the first bidirectional voltage converter to receive the second voltage. The power module includes a second battery coupled to the second bidirectional voltage converter to receive the third voltage. The power module includes a controller to control the first and second bidirectional voltage converters and the first and second batteries. The first voltage is for supplying power to a powertrain of the electric vehicle. The second voltage and the third voltage are for supplying power to the first and second batteries, respectively.

Aspects of the power module include the first voltage being 400V, the second voltage being 48V, and the third voltage being 12V.

Aspects of the power module include that the first battery supplies power to a first set of the auxiliary components that operate using the second voltage, and the second battery supplies power to a second set of the auxiliary components that operate using the third voltage.

Aspects of the power module include that the controller balances the loads on the first and second bi-directional voltage converters such that the first battery and the second battery receive a desired amount of power.

Aspects of the power module include that the first battery has a first capacity and the second battery has a second capacity different from the first capacity.

Aspects of the power module further include a support plate to support the first and second bidirectional voltage converters, the first and second batteries, and the controller.

Aspects of the power module include that the first and second batteries are arranged on a first face and at a first side of the support plate, and the controller and the first and second bidirectional voltage converters are arranged on the first face and at a second side of the support plate opposite to the first side.

Aspects of the power module include that the support plate, the first and second bidirectional voltage converters, the controller, and the first and second batteries are in a path of a coolant that travels from the first side toward the second side.

Aspects of the power module include that the support plate comprises a heat sink material.

Aspects of the power module include that the controller controls at least one of the first and second batteries to precharge the first and second bidirectional voltage converters prior to being connected to a third battery that supplies the first voltage.

Aspects of the power module include that the first bidirectional voltage converter includes a first I/O port to send and receive the first voltage and a second I/O port to send and receive the second voltage, and wherein the second bidirectional voltage converter includes a third I/O port to send and receive the first voltage and a fourth port to I/O send and receive the third voltage.

Aspects of the power module include that the first and second batteries, the controller, the second port and the fourth port are connected to a common ground or a common voltage.

Aspects of the power module include that in the event of a failure of a third battery that supplies the first voltage to the powertrain, the controller causes the first and second bidirectional voltage converters to convert at least one of the second voltage supplied by the first battery to the first voltage and the third voltage supplied by the second battery to the first voltage to temporarily supply power to the powertrain.

Embodiments include a power module for an electric vehicle, comprising a support plate. The power module includes a first battery to supply a first voltage to a first set of auxiliary components of the electric vehicle, and a second battery to supply a second voltage different from the first voltage to a second set of auxiliary components of the electric vehicle. The first battery and the second battery are attached to the support plate. The power module includes first and second bidirectional voltage converters coupled to the first and second batteries, respectively, and coupled to an external power source that supplies power to a powertrain of the electric vehicle. The first and second bidirectional voltage converters being attached to the support plate. The power module includes a controller to control operation of the first and second batteries through the first and second bidirectional voltage converters, the controller being attached the support plate.

Aspects of the power module further include a coolant channel to carry coolant. The first and second batteries are attached to the support plate such that when the support plate is in the coolant channel, the coolant cools the first and second batteries before cooling the first and second bidirectional voltage converters and the controller.

Aspects of the power module include that in a driving mode of the electric vehicle, the controller charges the first and second batteries through the first and second bidirectional voltage converters.

Aspects of the power module include that in a precharge operation for the electric vehicle, the controller causes the first and second batteries to precharge the first and second bidirectional voltage converters prior to being connected to the external power source.

Embodiments include a power system for an electrical vehicle, comprising a high voltage circuit that includes a high voltage source to supply a high voltage to a powertrain of the electric vehicle, and a low voltage circuit that includes at least two low voltage sources to supply at least two different low voltages to auxiliary components of the electric vehicle. The power system includes first and second bidirectional voltage converters coupled between the high voltage circuit and the low voltage circuit and that convert the high voltage provided by the high voltage source to the two different low voltages and that convert the two different low voltages provided by the at least two low voltage sources to the high voltage.

Aspects of the power system include that the low voltage circuit further comprises a controller to control the first and second bidirectional voltage converters and the at least two low voltage sources, a low voltage side of the first and second bidirectional voltage converters, and the auxiliary components.

Aspects of the power system include that the at least two low voltage sources, the controller, the low voltage side, and the auxiliary components share a common ground or a common voltage.

Any one or more of the aspects/embodiments as substantially disclosed herein.

Any one or more of the aspects/embodiments as substantially disclosed herein optionally in combination with any one or more other aspects/embodiments as substantially disclosed herein.

One or means adapted to perform any one or more of the above aspects/embodiments as substantially disclosed herein.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

The term "a" or "an" entity refers to one or more of that entity. As such, the terms "a" (or "an"), "one or more," and "at least one" can be used interchangeably herein. It is also to be noted that the terms "comprising," "including," and "having" can be used interchangeably.

The term "automatic" and variations thereof, as used herein, refers to any process or operation, which is typically continuous or semi-continuous, done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material."

Aspects of the present disclosure may take the form of an embodiment that is entirely hardware, an embodiment that is entirely software (including firmware, resident software, micro-code, etc.) or an embodiment combining software and hardware aspects that may all generally be referred to herein as a "circuit," "module," or "system." Any combination of one or more computer-readable medium(s) may be utilized. The computer-readable medium may be a computer-readable signal medium or a computer-readable storage medium.

A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electromagnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device. Program code embodied on a computer-readable medium may be transmitted using any appropriate medium, including, but not limited to, wireless, wireline, optical fiber cable, RF, etc., or any suitable combination of the foregoing.

The terms "determine," "calculate," "compute," and variations thereof, as used herein, are used interchangeably and include any type of methodology, process, mathematical operation or technique.

What is claimed is:

1. A power module for a vehicle, comprising:
   a first bidirectional voltage converter to convert a first voltage to a second voltage and convert the second voltage back to the first voltage;
   a second bidirectional voltage converter to convert the first voltage to a third voltage and convert the third voltage back to the first voltage;
   a first battery coupled to the first bidirectional voltage converter to receive the second voltage;
   a second battery coupled to the second bidirectional voltage converter to receive the third voltage; and
   a controller to control the first and second bidirectional voltage converters and the first and second batteries,
      wherein the first voltage is for supplying power to a powertrain of the vehicle, and
      wherein the second voltage and the third voltage are for supplying power to the first and second batteries, respectively.

2. The power module of claim 1, wherein the first voltage is 400V, the second voltage is 48V, and the third voltage is 12V.

3. The power module of claim 1, wherein the first battery supplies power to a first set of the auxiliary components that operate using the second voltage, and the second battery supplies power to a second set of the auxiliary components that operate using the third voltage.

4. The power module of claim 3, wherein the controller balances loads on the first and second bi-directional voltage converters such that the first battery and the second battery receive a desired amount of power.

5. The power module of claim 3, wherein the first battery has a first capacity and the second battery has a second capacity different from the first capacity.

6. The power module of claim 1, further comprising:
a support plate to support the first and second bidirectional voltage converters, the first and second batteries, and the controller.

7. The power module of claim 6, wherein the first and second batteries are arranged on a first face and at a first side of the support plate, and the controller and the first and second bidirectional voltage converters are arranged on the first face and at a second side of the support plate opposite to the first side.

8. The power module of claim 7, wherein the support plate, the first and second bidirectional voltage converters, the controller, and the first and second batteries are in a path of a coolant that travels from the first side toward the second side.

9. The power module of claim 6, wherein the support plate comprises a heat sink material.

10. The power module of claim 1, wherein the controller controls at least one of the first and second batteries to precharge the first and second bidirectional voltage converters prior to being connected to a third battery that supplies the first voltage.

11. The power module of claim 1, wherein the first bidirectional voltage converter includes a first I/O port to send and receive the first voltage and a second I/O port to send and receive the second voltage, and wherein the second bidirectional voltage converter includes a third I/O port to send and receive the first voltage and a fourth port to I/O send and receive the third voltage.

12. The power module of claim 11, wherein the first and second batteries, the controller, the second port, and the fourth port are connected to a common ground or a common voltage.

13. The power module of claim 1, wherein, in the event of a failure of a third battery that supplies the first voltage to the powertrain, the controller causes the first and second bidirectional voltage converters to convert at least one of the second voltage supplied by the first battery to the first voltage and the third voltage supplied by the second battery to the first voltage to temporarily supply power to the powertrain.

14. A power module for a vehicle, comprising:
a support plate;
a first battery to supply a first voltage to a first set of auxiliary components of the vehicle;
a second battery to supply a second voltage different from the first voltage to a second set of auxiliary components of the vehicle, the first battery and the second battery being attached to the support plate;
first and second bidirectional voltage converters coupled to the first and second batteries, respectively, and coupled to an external power source that supplies power to a powertrain of the vehicle, the first and second bidirectional voltage converters being attached to the support plate; and
a controller to control operation of the first and second batteries through the first and second bidirectional voltage converters, the controller being attached the support plate.

15. The power module of claim 14, further comprising:
a coolant channel to carry coolant, wherein the first and second batteries are attached to the support plate such that when the support plate is in the coolant channel, the coolant cools the first and second batteries before cooling the first and second bidirectional voltage converters and the controller.

16. The power module of claim 14, wherein, in a driving mode of the vehicle, the controller charges the first and second batteries through the first and second bidirectional voltage converters, respectively.

17. The power module of claim 16, wherein, in a precharge operation for the vehicle, the controller causes the first and second batteries to precharge the first and second bidirectional voltage converters prior to the first and second bidirectional voltage converts being connected to the external power source.

18. A power system for a vehicle, comprising:
a high voltage circuit that includes a high voltage source to supply a high voltage to a powertrain of the vehicle;
a low voltage circuit that includes at least two low voltage sources to supply at least two different low voltages to auxiliary components of the vehicle; and
first and second bidirectional voltage converters that are coupled between the high voltage circuit and the low voltage circuit; that convert the high voltage provided by the high voltage source to the two different low voltages; and that convert the two different low voltages provided by the at least two low voltage sources to the high voltage.

19. The power system of claim 18, wherein the low voltage circuit further comprises:
a controller to control the first and second bidirectional voltage converters and the at least two low voltage sources;
a low voltage side of the first and second bidirectional voltage converters; and
the auxiliary components.

20. The power module of claim 19, the at least two low voltage sources, the controller, the low voltage side, and the auxiliary components share a common ground or a common voltage.

* * * * *

UNITED STATES PATENT AND TRADEMARK OFFICE
CERTIFICATE OF CORRECTION

PATENT NO. : 10,442,375 B2
APPLICATION NO. : 15/654953
DATED : October 15, 2019
INVENTOR(S) : Adam H. Ing et al.

Page 1 of 1

It is certified that error appears in the above-identified patent and that said Letters Patent is hereby corrected as shown below:

In the Claims

Claim 14, Column 14, Line 11, after "attached" insert --to-- therein.
Claim 17, Column 14, Line 28, replace "converts" with --converters-- therein.
Claim 20, Column 14, Line 51, after "claim 19," insert --wherein-- therein.

Signed and Sealed this
Eighteenth Day of February, 2020

Andrei Iancu
*Director of the United States Patent and Trademark Office*